(12) United States Patent
Soda (10) Patent No.: US 7,754,543 B2
(45) Date of Patent: Jul. 13, 2010

(54) METHOD OF PATTERNING MULTIPLE-LAYERED RESIST FILM AND METHOD OF MANUFACTURING SEMICONDUCTOR DEVICE

(75) Inventor: Eiichi Soda, Tsukuba (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/638,499

(22) Filed: Dec. 14, 2006

(65) Prior Publication Data

US 2007/0141764 A1 Jun. 21, 2007

(30) Foreign Application Priority Data

Dec. 15, 2005 (JP) ............... 2005-361812

(51) Int. Cl.
*H01L 21/84* (2006.01)
*H01L 21/00* (2006.01)
(52) U.S. Cl. ..................... 438/151; 216/67
(58) Field of Classification Search ......... 438/714, 438/717, 725, 736, 734; 216/47, 51, 67, 216/72
See application file for complete search history.

(56) References Cited

U.S. PATENT DOCUMENTS

| | | | | |
|---|---|---|---|---|
| 6,541,361 B2* | 4/2003 | Ko et al. | ...................... | 438/585 |
| 6,787,455 B2* | 9/2004 | Tsai et al. | .................... | 438/638 |
| 7,067,235 B2* | 6/2006 | Tsai et al. | .................... | 430/312 |

| | | | | |
|---|---|---|---|---|
| 2006/0040206 A1* | 2/2006 | Nakashima et al. | ...... | 430/270.1 |
| 2006/0166128 A1* | 7/2006 | Gogolides et al. | ........ | 430/270.1 |

FOREIGN PATENT DOCUMENTS

| | | | |
|---|---|---|---|
| JP | 05-029211 | | 2/1993 |
| JP | 05-036599 | * | 2/1993 |
| JP | 05-217883 | | 8/1993 |
| JP | 2002-144744 | | 1/2002 |
| JP | 2002-110643 | | 4/2002 |

OTHER PUBLICATIONS

"Low Temperature Etching of Silylated Resist in Oxygen Plasma Generated by an Electron Cyclotron Resonsance Source"; Sung et. al.; Dec. 1993; Journal of Electrochemical Society, vol. 140, No. 12, pp. 3620-3623.*

* cited by examiner

*Primary Examiner*—Allan Olsen
(74) *Attorney, Agent, or Firm*—Young & Thompson (57) ABSTRACT

A method of patterning a multiple-layered resist film and a method of manufacturing a semiconductor device, which can provide an improved reliability of the semiconductor devices and a reduced operation time for an etch process, are provided. A method of patterning a multiple-layered resist film according to the present invention include: forming a lower layer resist film 104 on a semiconductor substrate; forming a silicon-containing upper layer resist film on the lower layer resist film 104; patterning the silicon-containing upper layer resist film into a predetermined geometry; and performing dry etching process for removing the lower layer resist film 104 through a mask of the patterned silicon-containing upper layer resist film 106 employing an etching gas containing oxygen ($O_2$) gas and argon (Ar) gas at a pressure within a range of from 0.075 mTorr to 50 mTorr both inclusive.

2 Claims, 13 Drawing Sheets

| EXPERIMENT | PRESSURE | O₂ | N₂ | NH₃ | CO | Ar | BOTTOM TEMP. |
|---|---|---|---|---|---|---|---|
| | mT | sccm | sccm | sccm | sccm | sccm | °C |
| 1 | 10 | 100 | | | | | 20 |
| 2 | 10 | | 100 | | | | 20 |
| 3 | 10 | | | 100 | | | 20 |
| 4 | 10 | | | | 100 | | 20 |
| 5 | 10 | 100 | 100 | | | | 20 |
| 6 | 10 | 100 | | 100 | | | 20 |
| 7 | 10 | 100 | | | 100 | | 20 |
| 8 | 10 | 100 | | | | 200 | 20 |
| 9 | 10 | | 100 | | | 200 | 20 |
| 10 | 10 | 100 | 100 | | | 200 | 20 |
| 11 | 10 | 100 | | 100 | | 200 | 20 |
| 12 | 10 | 100 | | | 100 | 200 | 20 |
| 13 | 50 | 100 | | | | 200 | 20 |
| 14 | 100 | 100 | | | | 200 | 20 |
| 15 | 10 | 200 | | | | 200 | 20 |
| 16 | 10 | 30 | | | | 200 | 20 |
| 17 | 10 | 100 | | | | 200 | −10 |
| 18 | 10 | 100 | | | | 200 | 60 |

METHOD OF PATTERNING MULTIPLE-LAYERED RESIST FILM AND METHOD OF MANUFACTURING SEMICONDUCTOR DEVICE

This application is based on Japanese patent application No. 2005-361,812, the content of which is incorporated hereinto by reference.

BACKGROUND

1. Technical Field

The present invention relates to a method of patterning a multiple-layered resist film and a method of manufacturing a semiconductor device.

2. Related Art

In processes for manufacturing semiconductor devices, a material patterning is generally carried out by a lithography process to form patterned photoresist film and a successive dry etching process using the patterned photoresist film as a etching mask.

As scaling down of semiconductor device proceeds, there needs to form device elements with a narrower pitch and a higher aspect ratio photoresist pattern, resulting in a reduced margin in lithgraphy process and a reduced mechanical stability of the patterned photoresist film against applied stress. One solution is to reduce the photoresist film thickness, but attended with insufficient etch resistivity of the photoreasist mask. A proposed solution for the issue is a method of patterning through a multiple-layered resist film, including: first of all, transferring a pattern onto an upper resist film; etching an underlying thick resist film through a mask of the upper patterned resist film; and etching a target material to be etched through a mask of the thick resist film.

Typical two types of patterning processes employing a multiple-layered resist film, a process employing a dual-layered resist film, and a process employing ternary-layered resist film, will be described.

Figure 12A:
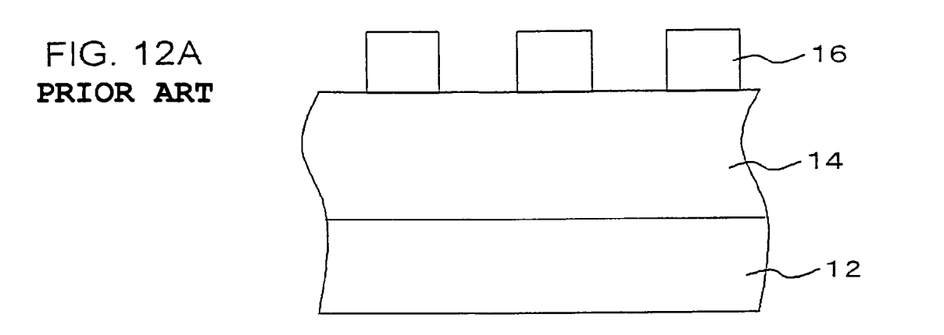
FIGS. 12A and 12B are cross-sectional views, schematically illustrating a conventional patterning process for a multiple-layered resist film.
Figure 12B:
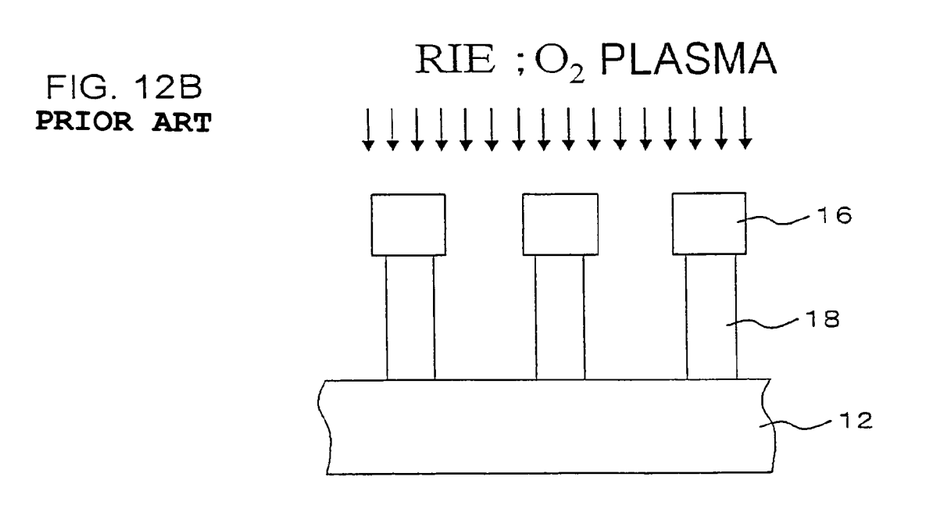

The patterning process employing a dual-layered resist film involves, as shown in FIG. 12A, sequentially depositing a lower layer resist film 14 and a silicon-containing upper layer resist film are on a target film 12 to be etched, and the silicon-containing upper layer resist film is exposed to light to transform a pattern of a photomask (not shown) onto a silicon-containing upper layer resist film 16. Then, as shown in FIG. 12B, a pattern on the upper layer resist film 16 is transferred onto the lower layer resist film 14 by a reactive ion etching (RIE) process. Typical etching gas employed is an oxygen($O_2$)-based gaseous mixture, in order to maintain sufficient etch selectivity for the silicon-containing upper layer resist film 16 against the organic film serving as the lower layer resist film 14.

Then, the pattern of the lower layer resist film 18 (and the silicon-containing upper layer resist film 16) is transferred onto the underlying target film 12 by dry etching process.

Figure 13A:
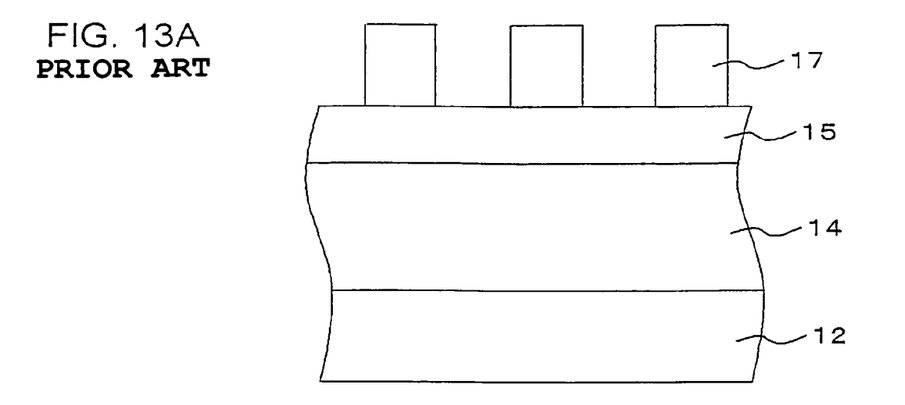
FIGS. 13A to 13C are cross-sectional views, schematically illustrating a conventional patterning process for a multiple-layered resist film.

In a patterning process employing a ternary-layered resist film, as shown in FIG. 13A, a lower layer resist film 14, a silicon-containing interlayer 15 (for example, spin on glass-applied film (SOG film)) and an upper layer resist film are sequentially deposited on a target film 12, and then, the upper layer resist film is exposed to light to transform a pattern of a photomask (not shown) onto an upper layer resist film 17.

Figure 13B:
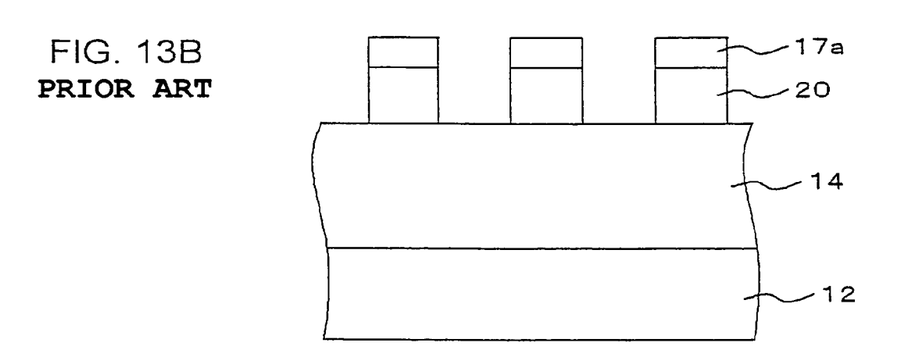

Next, as shown in FIG. 13B, the pattern on the upper layer resist film 17 is transferred onto the silicon-containing interlayer 15 by a RIE using a fluorocarbon-containing gas to form a patterned silicon-containing intermediate layer 20. Next, the pattern of silicon-containing intermediate layer 20 is transferred onto the lower layer resist film 14 by dry etching. Typical etching gas employed is an oxygen ($O_2$)-based gaseous mixture. Thereafter, similarly as in the case of the dual-layered resist, the pattern of the lower layer resist film 22 is transferred onto the underlying target film 12 by dry etching process.

As described above, thickness of the upper layer resist film can be reduced by utilizing a multiple-layered resist film, and a decrease in aspect ratio of the patterned resist film can be solved by processing the thicker lower layer resist film by a dry etch process with higher selectivity.

A typical etching gas employed for performig dry etching process for removing the lower layer resist film 14 is a gaseous mixture of He gas and $O_2$ gas described in Japanese Patent Laid-Open No. H5-29,211 (1997). In addition, a gaseous mixture of $O_2$ gas and a reduction gas is described in Japanese Patent Laid-Open No. H5-217,883 (1997), and carbon monoxide (CO) gas, disilane gas and the like are exemplified as the reduction gas. In Japanese Patent Laid-Open No. 2002-110,643, a gaseous mixture of $O_2$ gas with nitrogen ($N_2$) gas or CO gas is described.

Further, Japanese Patent Laid-Open No. 2002-14,474 describes an example of etching the lower layer resist film, which utilizes the upper layer resist film composed of a silicon-containing compound and employs an etching gas of a gaseous mixture containing $O_2$ gas and argon (Ar) gas at a vacuum level of 75 mTorr.

SUMMARY OF THE INVENTION

However, there are rooms for improvements in the conventional technologies described in the above-listed related art documents, in view of the following points.

Figure 13C:
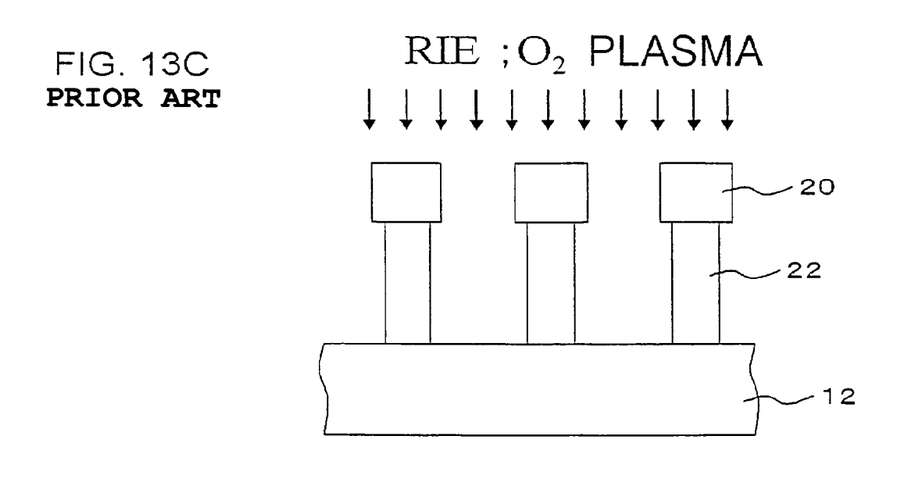

In the technology described in Japanese Patent Laid-Open No. H5-29,211, a gaseous mixture of $O_2$ gas and He gas is employed as an etching gas, and the use of such gaseous mixture may cause an etching of the side surfaces (side-etching) of the lower layer resist films 18 and 22, as shown in FIG. 12B and FIG. 13C.

While the technologies described in Japanese Patent Laid-Open No. H5-217,883 and Japanese Patent Laid-Open No. 2002-110,643 employ gaseous mixtures of $O_2$ gas with $N_2$ gas or CO gas as the etching gas, the use of such gaseous mixture may still cause an etching of the side surface (side-etching) of the lower layer resist film 18.

On the other hand, Japanese Patent Laid-Open No. 2002-14,474 describes an example of etching the lower layer resist film, which employs an etching gas of a gaseous mixture containing $O_2$ gas and Ar gas at a vacuum level of 75 mTorr. However, the technology also causes an etching of the side surface (side-etching) of the patterned lower layer resist film, and moreover, lower etch rate of the technology may require longer time for completing the etch process.

Since higher reactivity between an organic compound film and oxygen radical is exhibited in the RIE for the lower layer resist film employing $O_2$ gas, an etching of the side surface (side-etching) of the patterned lower layer resist film is easily caused. For example, a 45 nm-node design rule provides a narrower dimension such as an interconnect pitch of about 140 nm and a line width of about 70 nm, so that a dimensional tolerance of the pattern size formed in the lower layer resist film becomes very small, when a target film is etched by utilizing the lower layer resist film to form the interconnect pattern.

Further, the etch process for the target film to be etched simultaneously cause an additional etching of the lower layer resist film. In the case of formating interconnect trench for Cu interconnect line, for example, an increase in the dimension of the pattern induced by the side etch of the lower layer resist film causes an increase in the interconnect dimension, an increase in the line edge roughness, and a short circuit due to the interconnect contact or the like, leading to deteriorated reliability of semiconductor devices.

Thus, methods of patterning the multiple-layered resist film and methods of manufacturing the semiconductor device, which can improve a reliability of the semiconductor devices and reduce etch process time by inhibiting a side etch during the lower layer resist film etching, are demanded.

According to one aspect of the present invention, there is provided a method of patterning a multiple-layered resist film, comprising: forming a lower layer resist film on or over a semiconductor substrate; forming a silicon-containing upper layer resist film on the lower layer resist film; patterning the silicon-containing upper layer resist film into a predetermined geometry; and performing dry etching process for removing the lower layer resist film through a mask of the patterned silicon-containing upper layer resist film employing an etching gas containing oxygen ($O_2$) gas and argon (Ar) gas at a pressure within a range of from 0.075 mTorr to 50 mTorr both inclusive.

In the present invention, a gaseous mixture of $O_2$ gas and Ar gas is employed for the etching gas. Having this configuration, the upper layer resist composed of a silicon-containing compound is sputtered during the etch process so that silicon-containing deposits are adhered onto the side surface of the lower layer resist, thereby inhibiting the side etch of the lower layer resist. Therefore, a desired pattern can be formed on the target film without increasing the dimension of the pattern formed on the lower layer resist, thereby providing an improved reliability of the semiconductor device. Further, since the etch process is conducted at a pressure within the above-described range, an increased anisotropy and an increased etch rate of the etch process employing the aforementioned etching gas can achieved, thereby providing a reduced etch process time.

According to another aspect of the present invention, there is provided a method of manufacturing a semiconductor device, comprising: forming a target film on or over a semiconductor substrate; depositing a lower layer resist film and a silicon-containing upper layer resist film on the target film to form a multiple-layered resist film according to the above-described method; patterning the silicon-containing upper layer resist film and the lower layer resist film in sequence according to the above-described method; and etching the target film through a mask of the patterned lower layer resist film.

Such method provides an improved reliability of semiconductor devices and an improved production yield of semiconductor devices.

According to the present invention, the side etch during the lower layer resist etching is inhibited, so that an increase in the dimension of the pattern is prevented. Therefore, a desired pattern can be formed on the target film, such that an improved reliability of semiconductor devices and an improved production yield of semiconductor devices can be obtained. Further, a reduced etching process time can be presented.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, an identical numeral is assigned to an element commonly appeared in the figures, and redundant descriptions thereof will not be repeated.

First Embodiment

Figure 1A:
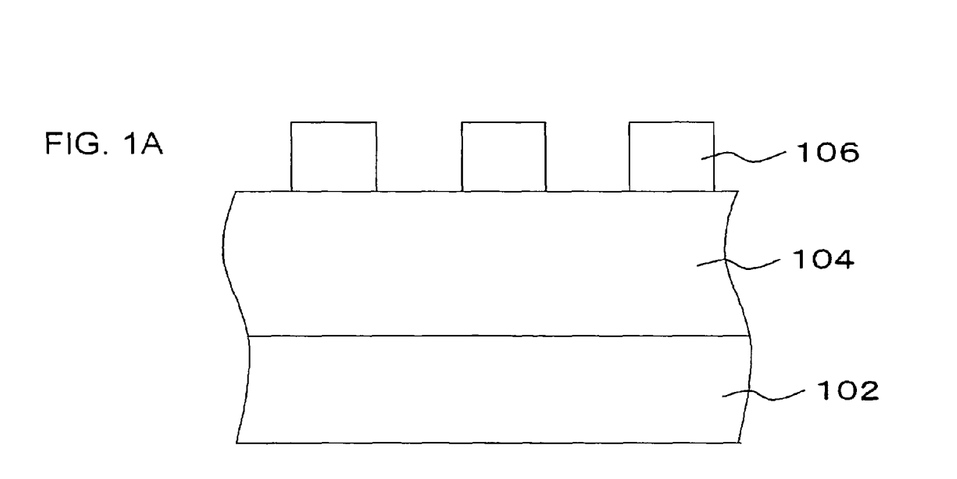
FIGS. 1A and 1B are cross-sectional views, schematically illustrating a patterning process for a multiple-layered resist film according to first embodiment.

In the present embodiment, a case of employing a dual-layered resist will be described for an exemplary implementation. A process for patterning a multiple-layered resist film of the present embodiment includes the following operations:

(i) an operation for forming a lower layer resist film 104 on or over a semiconductor substrate;

(ii) an operation for forming a silicon-containing upper layer resist film on the lower layer resist film 104 (FIG. 1A);

(iii) an operation for patterning the silicon-containing upper layer resist film into a predetermined geometry (FIG. 1A); and (iv) an operation for performing dry etching process for removing the lower layer resist film 104 through a mask of the patterned silicon-containing upper layer resist film 106 employing an etching gas containing oxygen ($O_2$) gas and argon (Ar) gas at a pressure within a range of from 0.075 mTorr to 50 mTorr both inclusive (within a range of from about 0.01 Pa to about 6.7 Pa both inclusive).

Following descriptions will be made along respective operations. First of all, the lower layer resist film 104 and the silicon-containing upper layer resist film are sequentially deposited in this order on a target film 102 formed on or over the semiconductor substrate, which is not shown in the diagrams. Film thickness of the lower layer resist film 104 is within a range of about 100 nm to 400 nm, and film thickness of the upper layer resist film is about 30 nm to 100 nm.

Processes available for forming the lower layer resist film 104 may include a coating process, a chemical vapor deposition (CVD) process and the like. In the present embodiment, a chemical vapor deposition process is employed. The chemical vapor deposition process is considered as being capable of presenting finer lower layer resist film 104 as compared with the case of employing the coating process, and therefore the film formed by the CVD process is difficult to be side etched in the operation for etching the lower layer resist film 104 as discussed later. Further, the lower layer resist film 104 formed by the chemical vapor deposition process exhibits an effect of blocking a diffusion of amine from the lower part thereof, leading to an inhibition to an acid deactivation of the upper layer resist film in a lithographic operation, thereby providing an improved resolution in the lithographic operation.

Typical silicon-containing photosensitive compositions for forming the upper layer resist film include: a silicon-containing photosensitive composition for UV-exposure, obtained by mixing alkali-soluble ladder polysiloxane having silicon atom in its main chain in a resist composition composed of a novolac resin and naphthoquinone diazide; a chemically amplified silicon-containing photosensitive composition, obtained by employing an acidolysis group-containing vinyl polymer having silicon atom in its side-chain and a photoacid generator; a chemically amplified silicon-containing photosensitive composition, obtained by employing acidolysis group-containing siloxane polymer having silicon atom in its main chain; or the like. The upper layer resist film is typically formed by employing the above-described composition by a coating process.

Figure 1B:
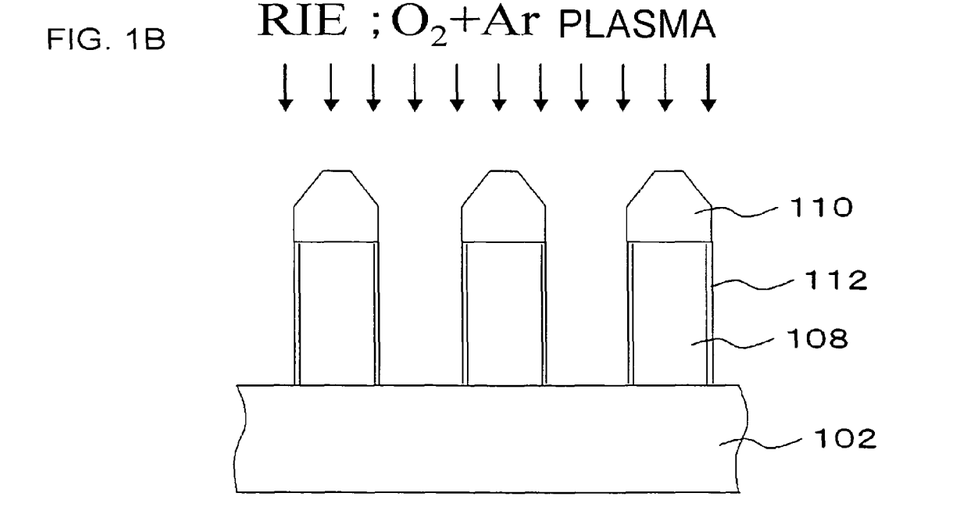

Subsequently, the silicon-containing upper layer resist film is exposed to light through a predetermined pattern to form the silicon-containing upper layer resist film 106 (FIG. 1A). Then, the lower layer resist film 104 is etched by a RIE process through a mask of silicon-containing upper layer resist film 106 to form a lower layer resist film 108 having a pattern transferred thereon (FIG. 1B).

The RIE process is conducted under the following conditions.

(Vacuum Level)

The RIE is conducted at a pressure within a range of from 0.075 mTorr to 50 mTorr both inclusive, and preferably at a pressure within a range of from 0.075 mTorr to 15 mTorr both inclusive. Implementation of the etch process at a pressure within the above-described range achieves an increased etch anisotropy to inhibit the side etch, and also achieves an increased etch rate. Therefore, a reduced etch process time can be presented. In particular, anisotropy of the etch process employing the etching gas can be further increased and the side etch can be further inhibited by employing a pressure within the preferable range as described above.

(Etching Gas)

A gaseous mixture containing $O_2$ gas and Ar gas is employed for the etching gas of the present embodiment. As such, Ar gas, which is an inert gas, is included in the etching gas. It is considered that the use of such etching gas promotes a sputtering of the upper layer resist film 110 composed of a silicon-containing compound during the etch process and a physical adhesion of a silicon (Si)-containing deposit 112 onto the side surface of the lower layer resist film 108, as shown in FIG. 1B, so that the side etch of the lower layer resist film 108 would be inhibited. Since the Si-containing deposit 112 exhibits larger selectivity for oxygen radical, the use of such etching gas can provides an effectively inhibition of the side etch. Therefore, an improved reliability of semiconductor devices can be presented without increasing the dimension of the pattern. Further, Ar is not an expensive material, and thus preferably be employed.

Rate of flow rates of $O_2$ gas and Ar gas is within a range of from 1:0.05 to 1:10, and preferably within a range of from 1:1 to 1:3. The rate of flow rates ratio within the above-described range promotes higher etch rate for the lower layer resist film, which is an organic film, thereby effectively inhibiting the side etch.

The etching gas may further include one or more other gas selected from a group consisting of $N_2$, $NH_3$ and CO. Preferably, $NH_3$ gas is employed. An use of $NH_3$ gas as a deposition gas is effective in inhibiting the side etch, since deposits such as a carbon-nitrogen bond or a carbon-hydrogen bond containing compound, which are reaction products of $NH_3$ gas with the lower layer resist film, are adhered onto the side surface of the lower layer resist. When the above-described other gases are employed, ratio of flow rates of a combination of $O_2$ gas and Ar gas with the above-described other gas is 1:0.01 to 1:4. If the ratio of flow rates is within the above-described range, the side etch can be more effectively inhibited.

Further, in the present embodiment, a noble gas such as helium (He), neon (Ne), krypton (Kr), xenon (Xe) or radon (Rn) is added as an etching gas.

(Temperature of Semiconductor Substrate)

Temperature of the semiconductor substrate is within a range of from −20 degree C. to 20 degree C. both inclusive. A temperature within the above-described range may promote an adhesion of deposits of reaction products onto the side surface, such that it is useful in inhibiting the side etch.

As described above, after the lower layer resist film 108 is formed, the operation for etching the target film 102 is conducted through a mask of the remaining upper layer resist film 110 and the lower layer resist film 108 according to ordinary conditions to manufacture the semiconductor device.

Advantageous effects obtainable by the configuration according to the present embodiment will be described.

In the present embodiment, Ar gas, which is an inert gas, is included in the etching gas. It is considered that the use of such etching gas in this configuration promotes a sputtering of the upper layer resist film composed of a silicon-containing compound during the etch process and a physical adhesion of a Si-containing deposit onto the side surface of the lower layer resist film. Therefore, a side etch of the lower layer resist film can be inhibited, and thus an improved reliability of semiconductor devices can be presented without increasing the dimension of the pattern. Further, since the etch process is conducted at a pressure within the above-described range, an increased etch anisotropy and an increased etch rate can be achieved. Therefore, a reduced operation time for the etch process can be presented.

Second Embodiment

Figure 2A:
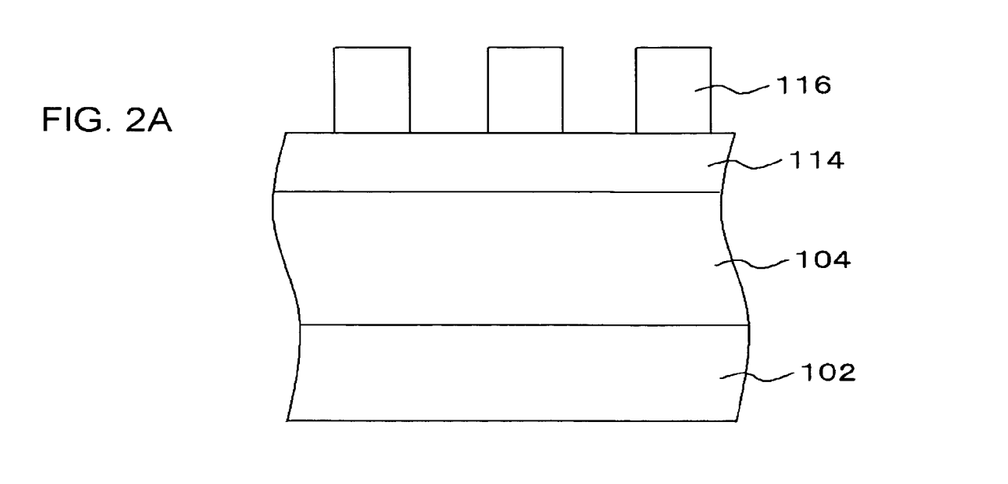
FIGS. 2A to 2C are cross-sectional views, schematically illustrating a patterning process for a multiple-layered resist film according to second embodiment.

A process for patterning a multiple-layered resist film of the present embodiment includes the following operations:
(i) an operation for forming a lower layer resist film 104 on a semiconduct or substrate;
(ii) an operation for forming a silicon-containing upper layer resist film (multiple-layered film of silicon-containing intermediate layer and upper layer resist film) on the lower layer resist film 104 (FIG. 2A);
(iii) an operation for patterning the upper layer resist film into a predetermined geometry (FIG. 2A); and
(iv) an operation for performing dry etching process for removing the lower layer resist film 104 through a mask of the patterned silicon-containing upper layer resist film (multiple-layered film of silicon-containing intermediate layer 115 and upper layer resist film 117) employing an etching gas containing oxygen ($O_2$) gas and argon (Ar) gas at a pressure within a range of from 0.075 mTorr to 50 mTorr both inclusive.

Following descriptions related to a case of employing ternary-layered resist film will be made along respective operations.

First of all, the lower layer resist film 104, a silicon-containing intermediate layer 114 and a resist film are sequentially deposited in this order on a target film 102 formed on or over the semiconductor substrate, which is not shown in the diagrams. Film thickness of the lower layer resist film 104 is within a range of about 100 nm to 400 nm, film thickness of the silicon-containing intermediate layer 114 is about 30 nm to 100 nm, and film thickness of the resist film is about 50 nm to 200 nm.

Typical silicon-containing intermediate layer 114 is silicon dioxide ($SiO_2$) film, silicon carbide (SiC) film, silicon nitride (SiN) film, silicon carbonitride (SiCN) film, silicon oxycarbide (SiOC) film, carbon-doped silicon oxide (SiOCH) film or the like, and $SiO_2$ film is employed in the present embodiment. $SiO_2$ film is formed by spin-on-glass coating process, CVD process or the like.

Figure 2B:
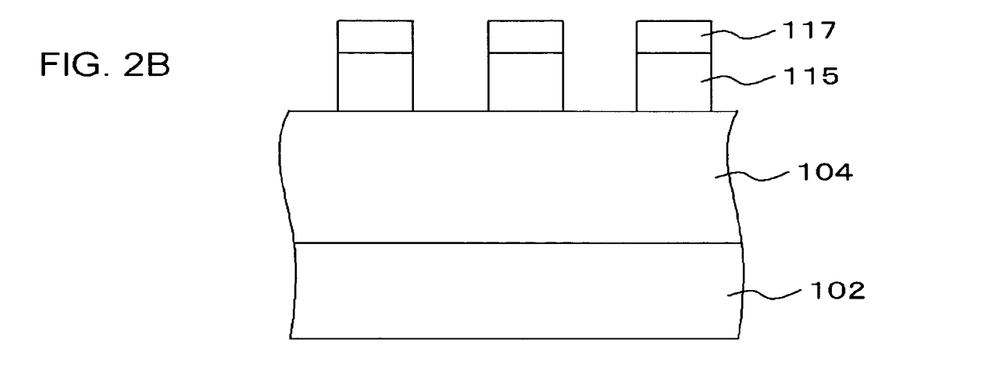

Subsequently, the resist film is exposed to light according to an ordinary exposure process to form an upper layer resist film 116 having a patterned geometry (FIG. 2A). Then, the silicon-containing intermediate layer 114 is etched through a mask of the upper layer resist film 116. As a result, the silicon-containing intermediate layer 115 is formed and the upper layer resist film 116 is also etched (FIG. 2B).

Figure 2C:
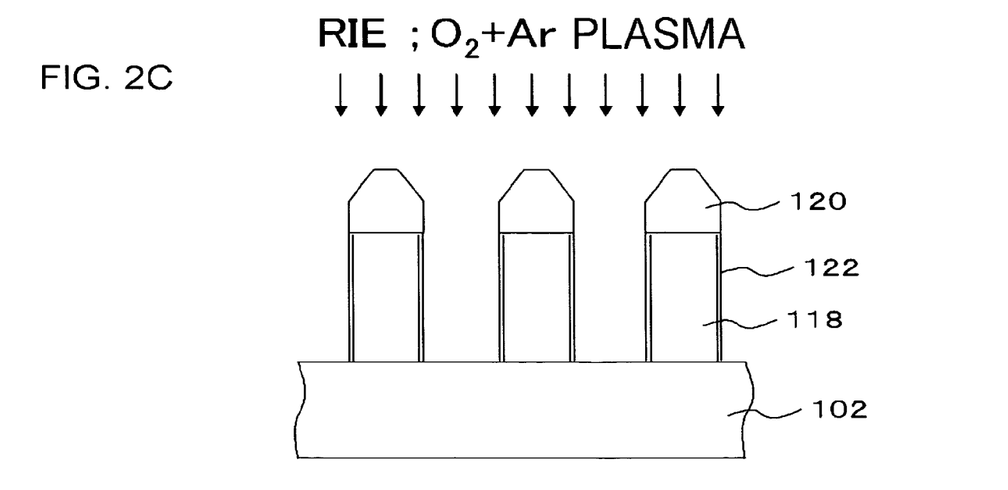

Then, the lower layer resist film 104 is processed by a RIE process through a mask of the multiple-layered film composed of the silicon-containing intermediate layer 115 and the upper layer resist film 117 to form a lower layer resist film 118 having a pattern transferred thereon (FIG. 2C). In addition to above, conditions for the RIE process is similar to that employed in first embodiment.

Having this configuration, the use of such etching gas promotes a sputtering of the silicon-containing intermediate layer 115 during the etch process and a physical adhesion of a Si-containing deposit 122 onto the side surface of the lower layer resist film 118, as shown in FIG. 2C, so that the side etch of the lower layer resist film 118 would be inhibited. Since the Si-containing deposit 122 exhibits larger selectivity for oxygen radical, the use of such etching gas can provides an effectively inhibition of the side etch. Therefore, an improved reliability of semiconductor devices can be presented without increasing the dimension of the pattern.

As described above, after the lower layer resist film 118 is formed, the operation for etching the target film 102 is conducted through a mask of the remaining the silicon-containing intermediate layer 120 and the lower layer resist film 118 according to ordinary conditions to manufacture the semiconductor device.

As described above, same advantageous effects obtainable by employing the configuration of first embodiment can also be obtained in the present embodiment.

While the preferable embodiments of the present invention have been described in reference to the annexed figures, it is not intended that the present invention is limited to the configurations illustrated in the above-described embodiments, and various modifications thereof are available.

While a dual layer structure and a ternary-layered structure are, for example, exemplified for the multiple-layered resist film, the structure of the resist film is not particularly limited thereto, and it is sufficient that the structure has two or more layers.

In addition, number of multiple layers of the resist film is not also particularly limited, and it is sufficient that the structure has two or more layers. Further, one or more of other type of film(s) except the resist film is formed.

EXAMPLES

Experiments 1 to 18

A multiple-layered resist film was etched by a same process as employed in first embodiment (FIGS. 1A and 1B). Here, structure of the multiple-layered resist film and the etch conditions were as follows:

<Etch Condition for Multiple-layered Resist Film>

Figure 4:
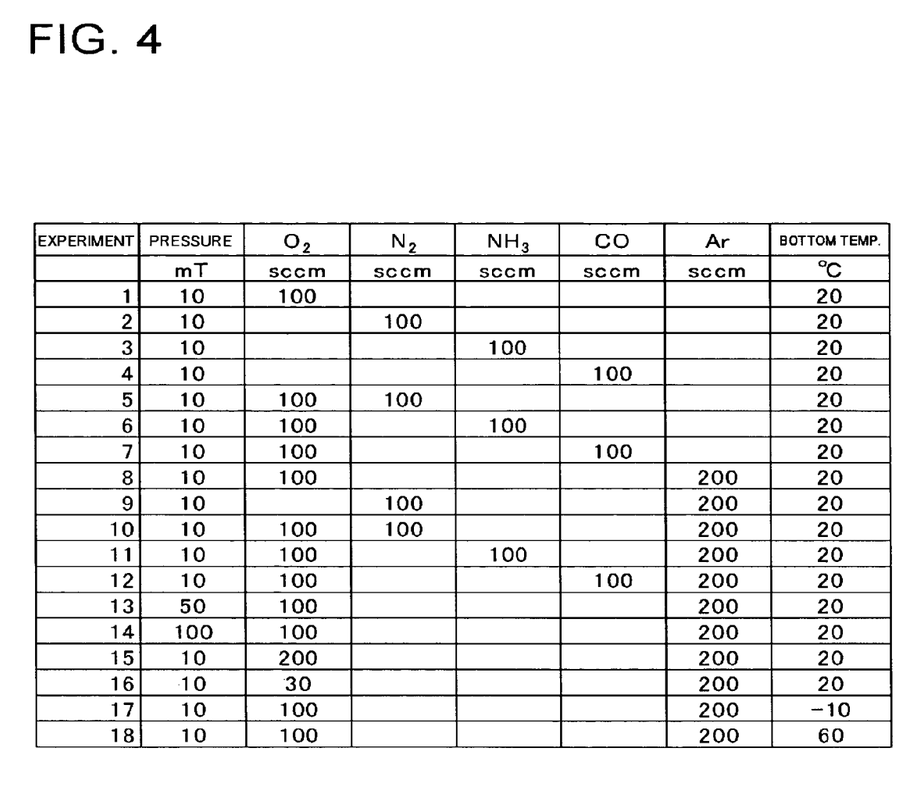
FIG. 4 is a table indicating conditions for etching the lower layer resist film in examples.

[Multiple-layered Resist Film]
    lower layer resist film: formed to a thickness of 300 nm (by employing a resist solution "B200" (commercially available from JSR Co., Ltd., Tokyo Japan));
    silicon-containing upper layer resist film: formed to a thickness of 90 nm (by employing a resist solution "JSF187" (commercially available from JSR Co., Ltd.));

[Exposure Condition for Upper Layer Resist Film]
    F2 exposure (a pattern having line width of 70 nm/space of 70 nm is formed);

[Condition for Dry Etch for Lower Layer Resist Film]
    etcher: dual-frequency RIE apparatus;
    etching gas: $O_2$ gas, $N_2$ gas, $NH_3$ gas, CO gas, Ar gas (see FIG. 4);
    etching condition: pressure, flow rate of the etching gas and temperature of the semiconductor substrate are shown in FIG. 4. Here, the etch rates for the lower layer resist shown FIGS. 5 to 11 were separately measured.

<Evaluation>

Figure 3:
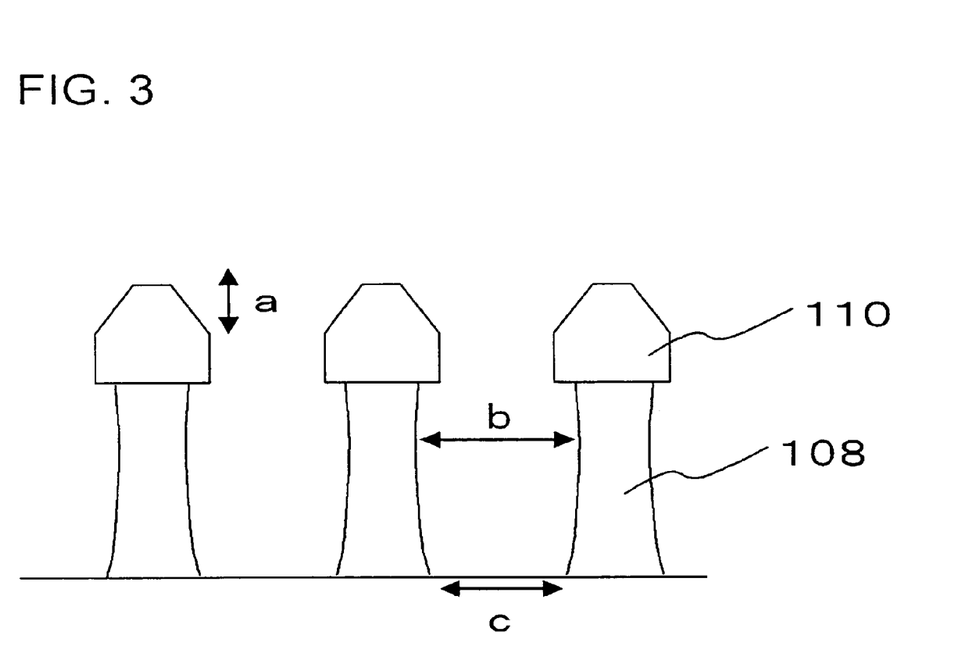
FIG. 3 is a cross-sectional view, schematically showing an etched multiple-layered resist film, useful in describing evaluation in examples.

Geometry of the etched lower layer resist film was observed using a cross sectional scanning electron microscope (SEM). As a result, as shown in FIG. 3, facet size (beveled shoulder) a, space distance b between the lower layer resist films 108 at a vertical position of ⅔ of the height of the lower layer resist film 108, and space distance c between the lower layer resist films 108 at their bottoms were calculated. Facet size a, space distances b and c were calculated by taking average values of ten locations. Here, target values thereof were set as: size a: equal to or less than 45 nm; space distances b and c between the lower layer resist films 108: 60 to 70 nm; and etch rate: equal to or larger than 400 nm.

Reasons for measuring the facet size a are as follows.

When the film thickness of the silicon-containing upper layer resist film is smaller, an increased facet size causes an etching of the shoulder of the upper layer resist film, when the lower layer resist film, which is an organic film, is etched. Therefore, the portion of the lower layer resist film right under the shoulder easily reacts with $O_2$ in the etching gas to be etched, providing an increased line width, and eventually causing an issue of dimension shift. Further, a low dielectric constant (low-k) film is employed for a target film, it is preferable that slight amount of the silicon-containing upper layer resist film is remained after the lower layer resist film is etched. More specifically, a desired geometry of the low-k film, which is etched through a mask of the patterned lower layer resist film, can be obtained, if a portion of the silicon-containing upper layer resist film is remained, which leads to provide an increased remaining mask film for the lower layer resist film (for example, improvement in line edge roughness).

<Results>

Results of Experiments 1 to 18 will be described in reference to FIGS. 5 to 11 as follows. Here, Experiments 8, 10 to 13 and 15 to 18 are Examples according to the configuration of the present invention. In addition to above, space distance b is referred to as "lower layer Mid dimension", and space distance c is referred to as "lower layer Btm dimension" in each of the tables.

Figure 5:
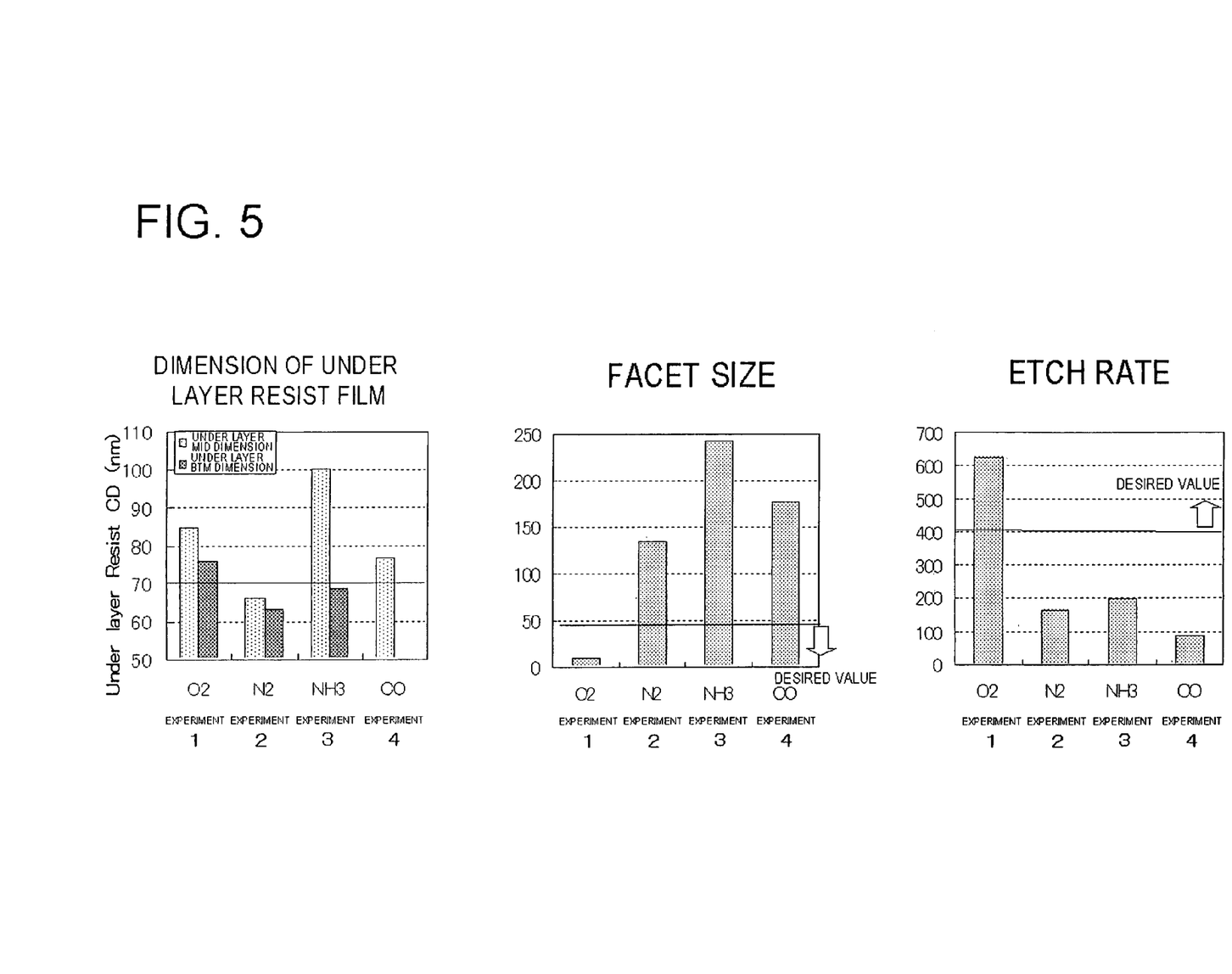
FIG. 5 contains graphs showing measurement results of dimension of the lower layer resist, facet size and etch rate, respectively, in examples.

Experiments 1 to 4 (FIG. 5)

Results obtained by etching the lower layer resist film employing a single gas ($O_2$ gas, $N_2$ gas, $NH_3$ gas, CO gas) are shown in graphs of FIG. 5. These etching gases were employed for the purpose of utilizing reference exemplary implementations showing advantageous effects of the present invention. In case of employing $O_2$ gas (Experiment 1), it is confirmed that reactivity of $O_2$ gas with the lower layer resist film, which is an organic film, was larger, and thus an etch rate was the largest, and therefore a considerable side etch was observed. On the other hand, in Experiment 2 ($N_2$ gas), Experiment 3 ($NH_3$ gas) and Experiment 4 (CO gas), etch rates were smaller (FIG. 5). Therefore, etching time was increased in each of these cases (see FIG. 4), and facet size was increased.

Figure 6:
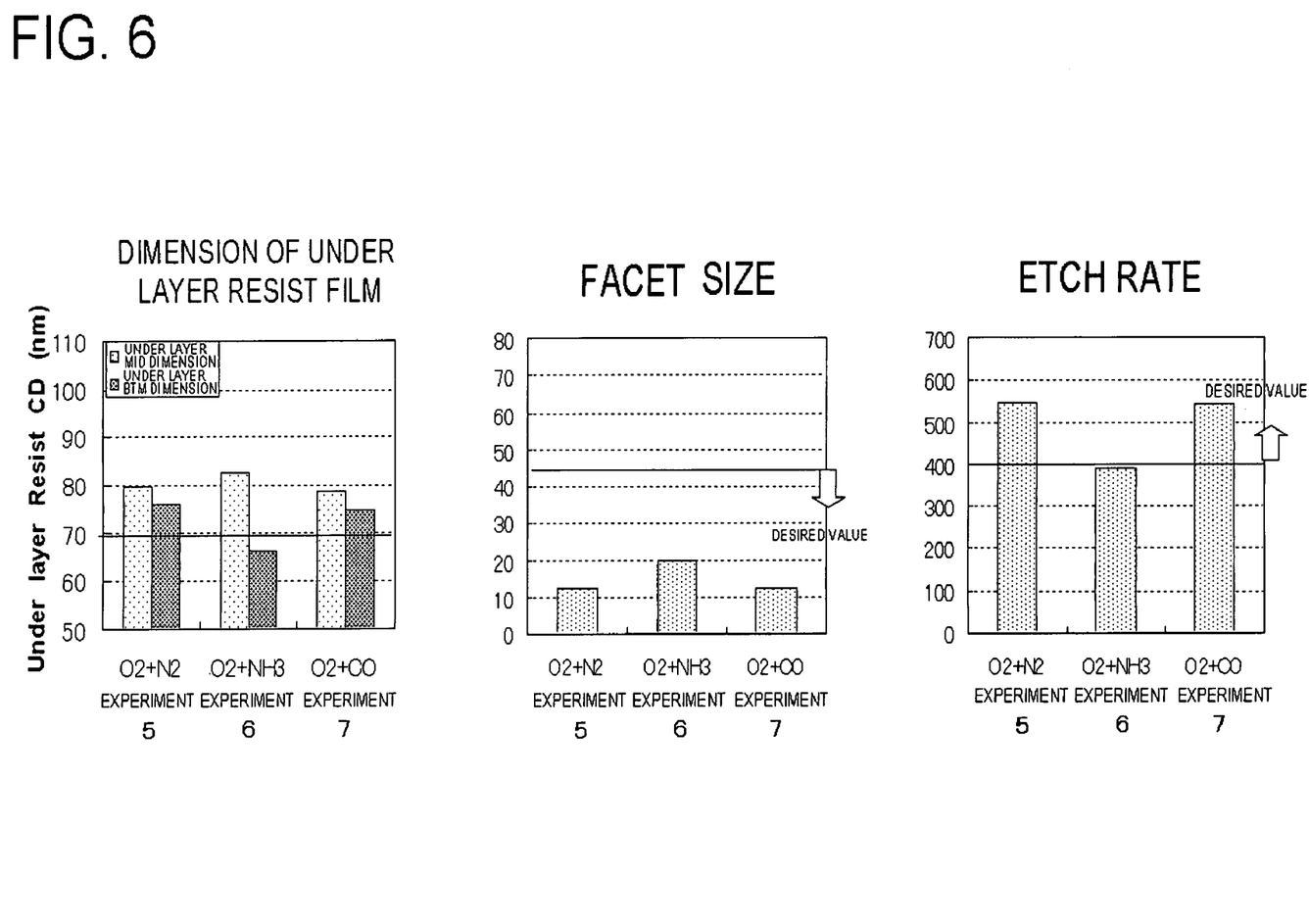
FIG. 6 contains graphs showing measurement results of dimension of the lower layer resist, facet size and etch rate, respectively, in examples.

Experiments 5 to 7 (FIG. 6)

Results obtained by etching the lower layer resist film employing a gaseous mixture of $O_2$ gas and a deposition gas of $N_2$ gas, $NH_3$ gas or CO gas are shown in graphs of FIG. 6. These etching gases are conventionally employed, and thus these Experiments are reference exemplary implementations. In addition to above, pressure in a chamber was set to 10 mTorr.

As shown in FIG. 6, an use of $NH_3$ gas can provide an inhibition for increasing the space distance c at the bottom of lower layer resist, but also provides a side etch, and therefore unwanted increase of the space distance b between the lower layer resists is not improved.

Figure 7:
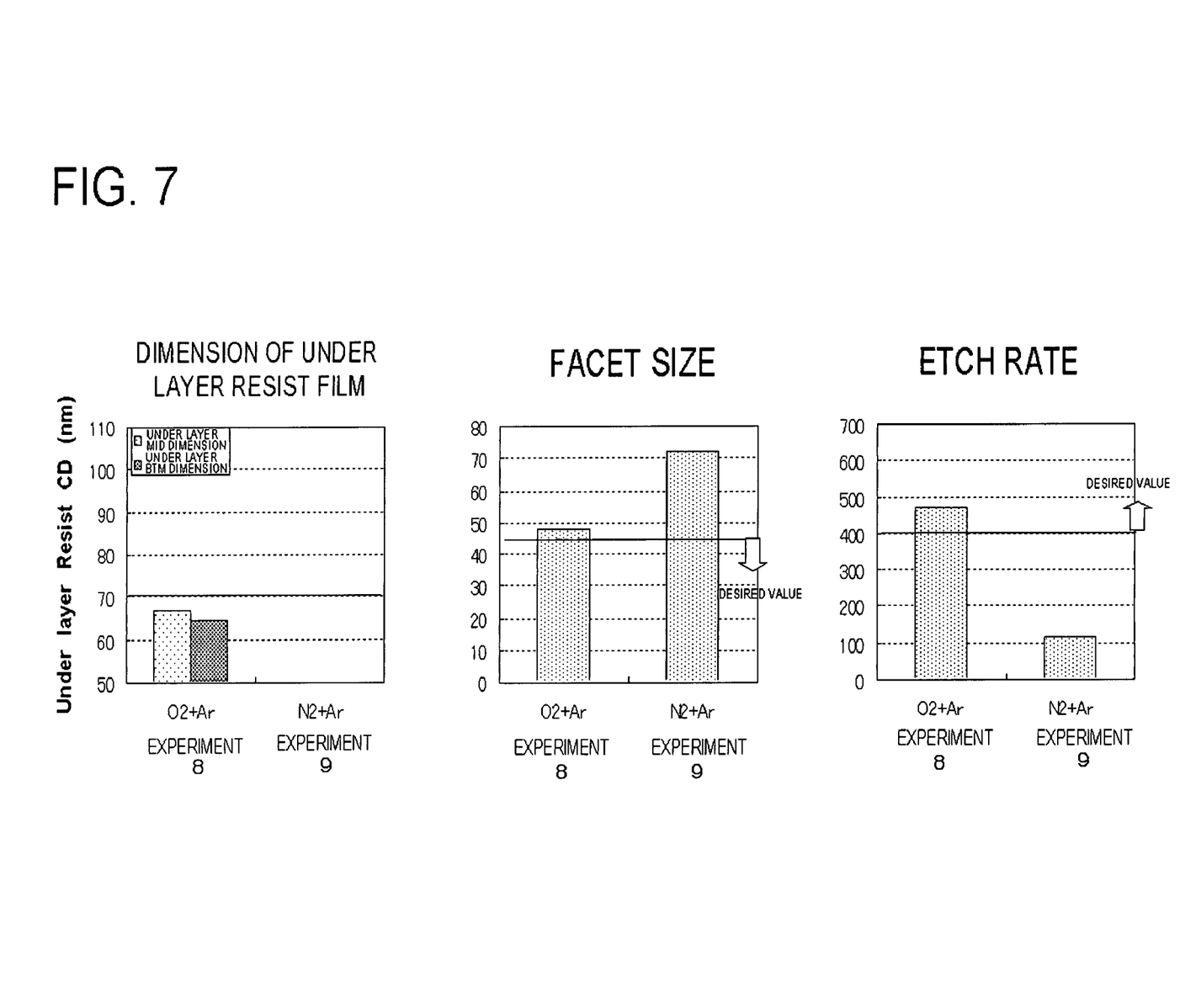
FIG. 7 contains graphs showing measurement results of dimension of the lower layer resist, facet size and etch rate, respectively, in examples.

Experiments 8 and 9 (FIG. 7)

Results obtained by etching the lower layer resist film employing a gaseous mixture of $O_2$ gas and Ar gas and a gaseous mixture of $N_2$ gas and Ar gas are shown in graphs of FIG. 7. In addition to above, pressure in a chamber was set to 10 mTorr.

As shown in FIG. 7, while an use of the gaseous mixture of $O_2$ gas and Ar gas provided a slightly increased facet size, as compared with Experiment 1, the side etch was inhibited. Increases in the space distances b and c were inhibited in the lower layer resist, and thus better results were obtained. A use of the gaseous mixture of $N_2$ gas and Ar gas did not induce an etching of the lower layer resist film.

Figure 8:
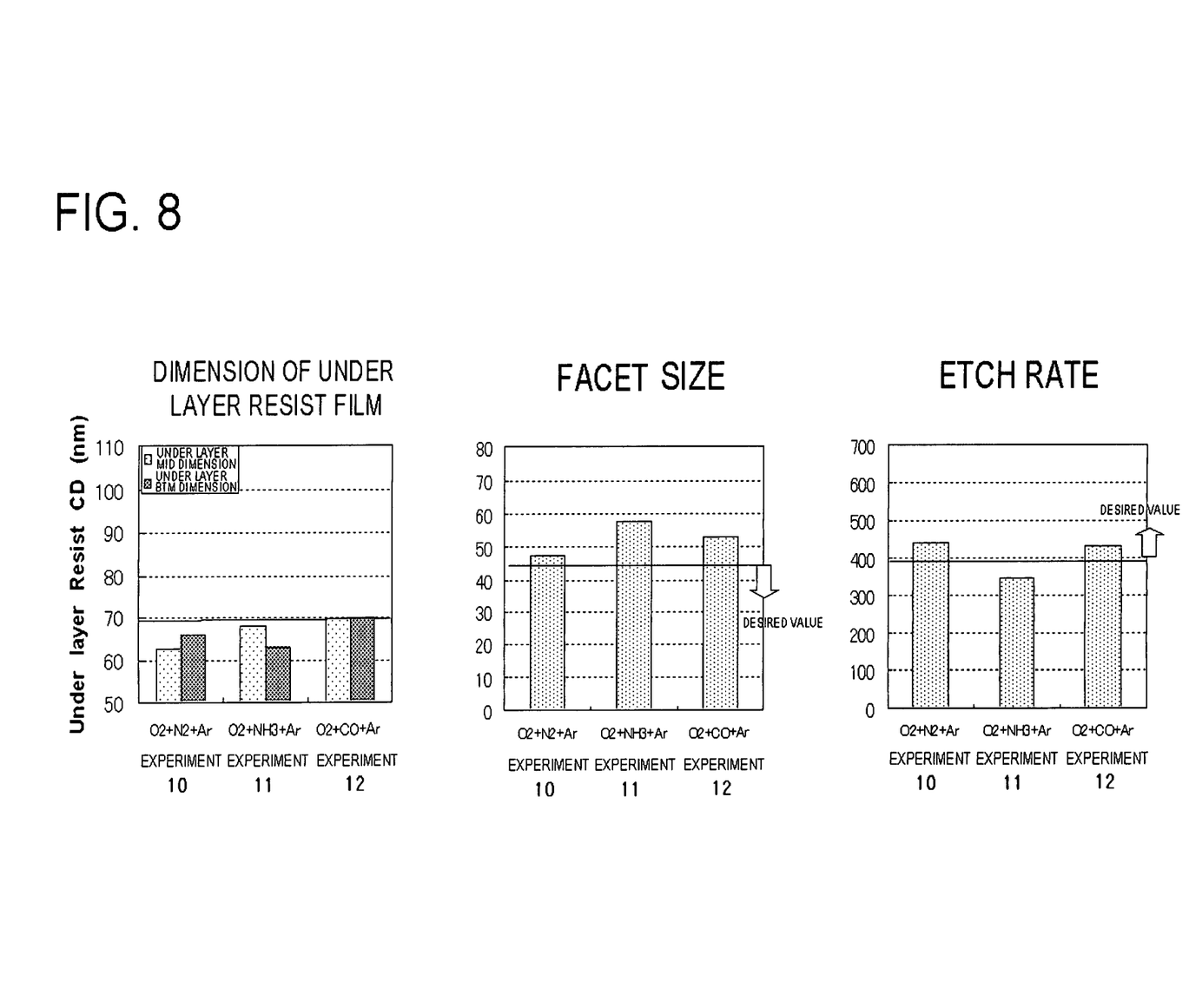
FIG. 8 contains graphs showing measurement results of dimension of the lower layer resist, facet size and etch rate, respectively, in examples.

Experiments 10 to 12 (FIG. 8)

Results obtained by etching the lower layer resist film employing a gaseous mixture of $O_2$ gas, $N_2$ gas and Ar gas, a gaseous mixture of $O_2$ gas, $NH_3$ gas and Ar gas and a gaseous mixture of $O_2$ gas, CO gas and Ar gas are shown in graphs of FIG. 8. In addition to above, pressure in a chamber was set to 10 mTorr. As shown in FIG. 8, better results were obtained for all etching gases, and in particular, an increase of space distance c in lower layer resist was further inhibited in the case of employing the gaseous mixture of $O_2$ gas, $NH_3$ gas and Ar gas, as compared with the case of employing the gaseous mixture of $O_2$ gas and Ar gas. It was confirmed according to such results that an effect for inhibiting the side etch was obtained, when the etch process is conducted at a pressure in the chamber of equal to or lower than 10 mTorr and employing the gaseous mixture of $O_2$ gas and Ar gas as the etching gas for lower layer resist film. Further, it was confirmed that the above-described advantageous effects can be obtained by employing the gaseous mixture of $O_2$ gas, Ar gas and $NH_3$ gas.

Figure 9:
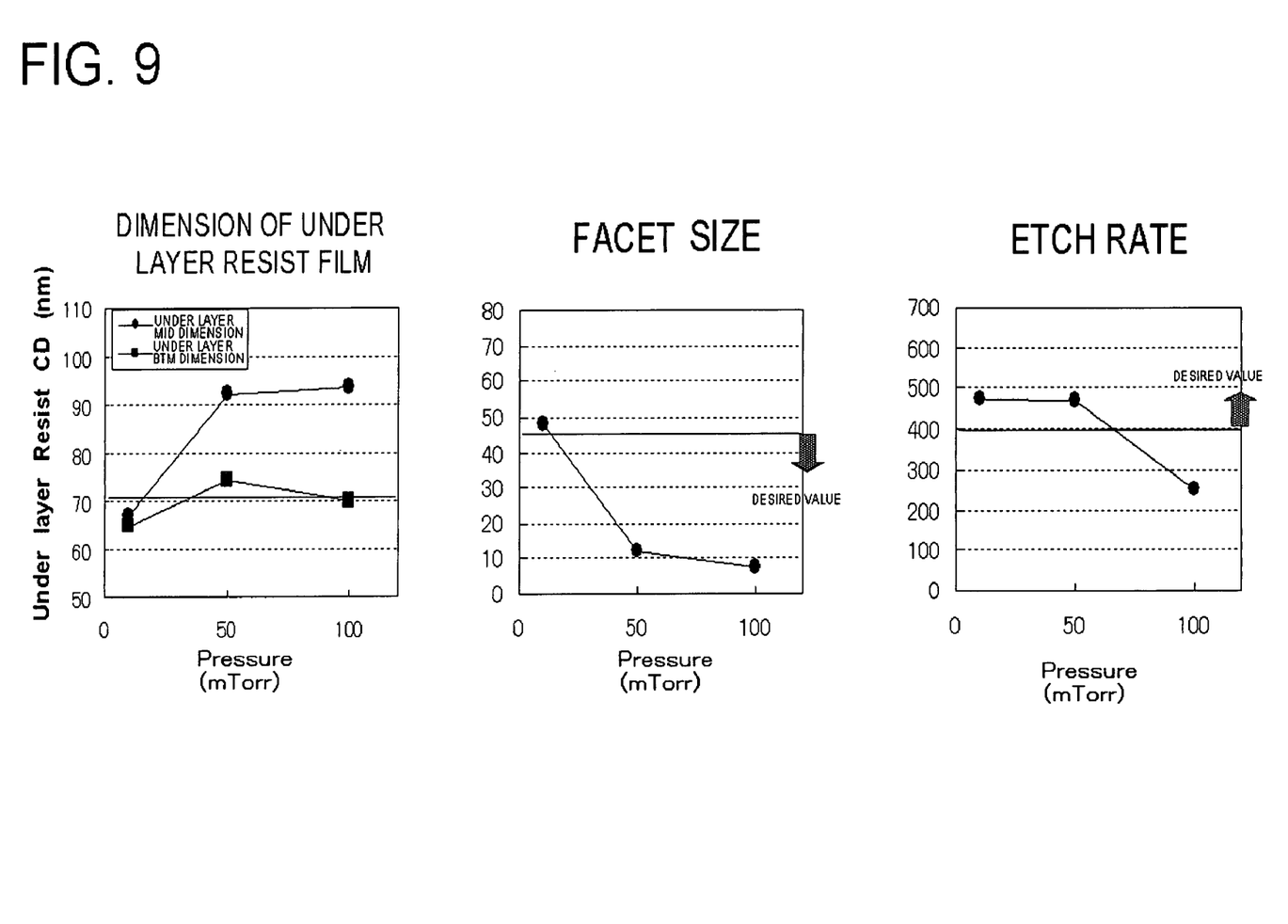
FIG. 9 contains graphs showing measurement results of dimension of the lower layer resist, facet size and etch rate, respectively, in examples.

Experiments 8, 13 and 14 (FIG. 9)

Results obtained by etching the lower layer resist film employing a gaseous mixture of $O_2$ gas and Ar gas at a chamber pressure of 10 mTorr (Experiment 8), 50 mTorr (Experiment 13) and 100 mTorr (Experiment 14) are shown in graphs of FIG. 9. While a reduced pressure provided an increased etch anisotropy by utilizing ion, causing an increased facet size, increases in space distances b and c were inhibited in the lower layer resist. On the contrary, increases in the space distances b and c were confirmed at a pressure of 60 mTorr. As such, concerning the pressure in the chamber, a pressure within a lower pressure range (0.075 mTorr to 50 mTorr both inclusive) provides a reduced dimension. Here, the lowest value in the above-described lower pressure range (0.075 mTorr) is, in general, a minimum pressure that can be practically achieved in a critical vacuum operation for etching apparatus.

Figure 10:
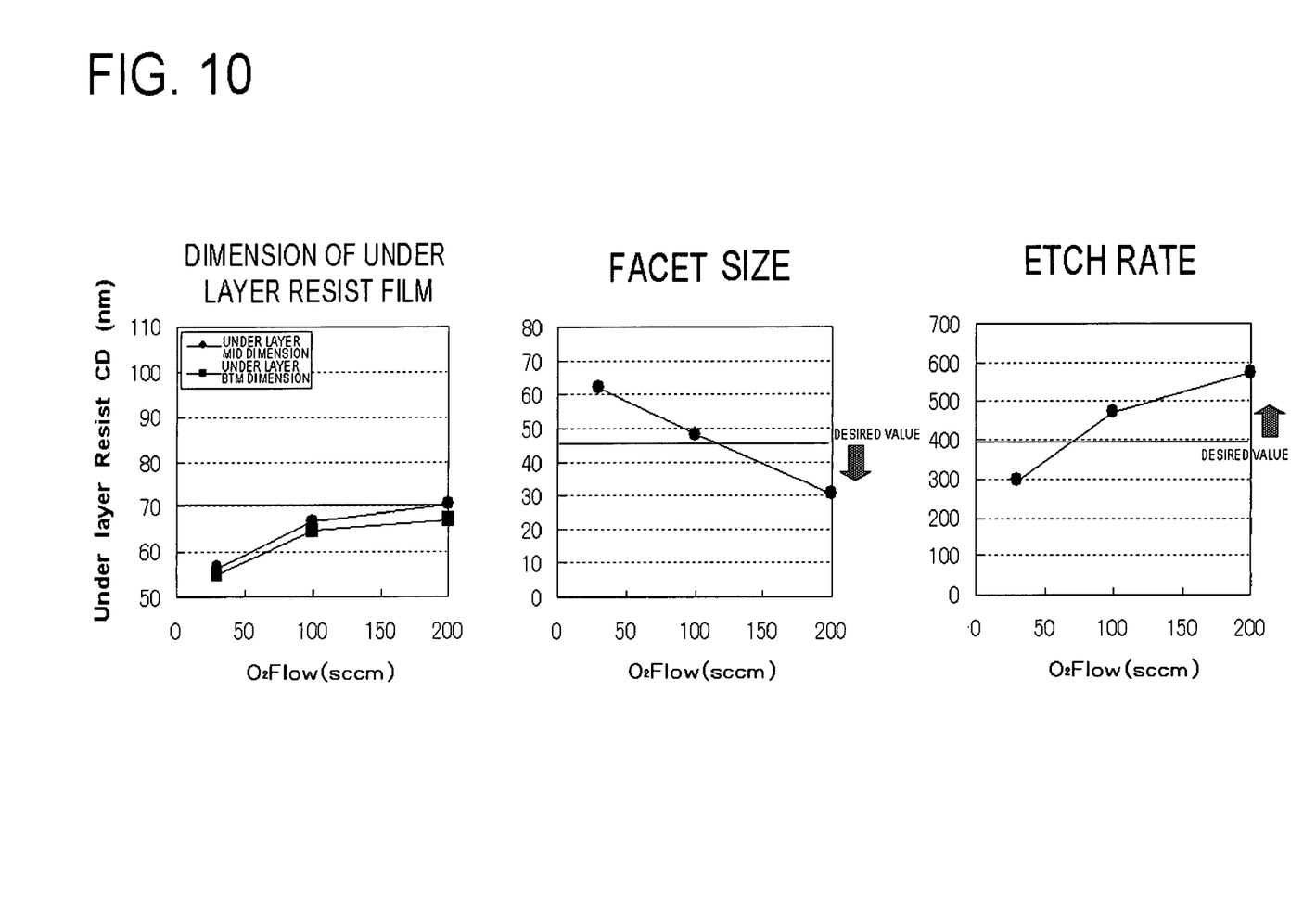
FIG. 10 contains graphs showing measurement results of dimension of the lower layer resist, facet size and etch rate, respectively, in examples.

Experiments 16, 8 and 15 (FIG. 10)

Results obtained by etching the lower layer resist film employing a gaseous mixture of $O_2$ gas and Ar gas at a chamber pressure of 10 mTorr and at $O_2$ gas flow rate of 30 sccm (Experiment 16), 100 sccm (Experiment 8) and 200 sccm (Experiment 15) are shown in graphs of FIG. 10. Results show that a reduced dimension and a reduced facet size were trade off, and $O_2$ gas flow rate of about 100 sccm provided a preferable result.

Figure 11:
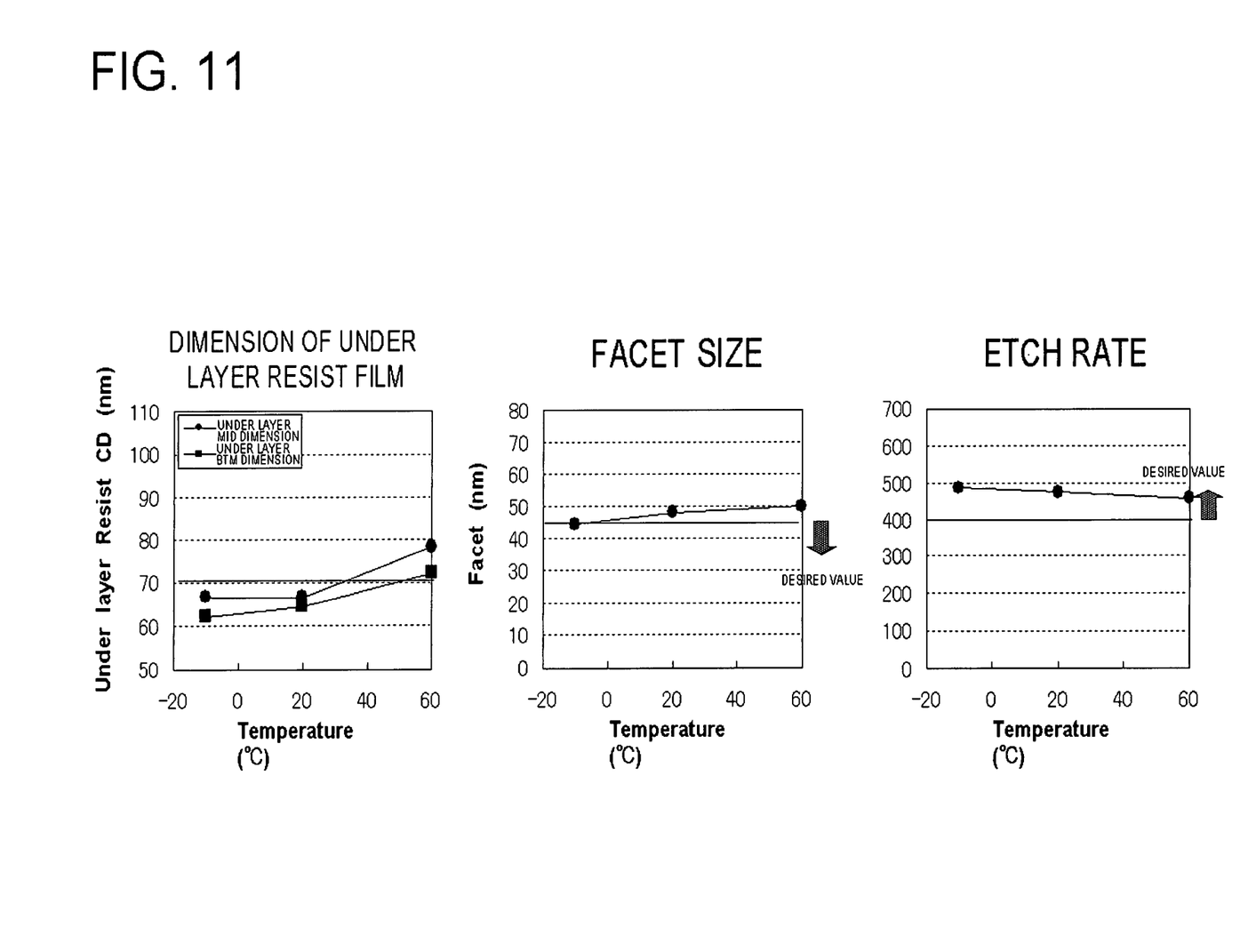
FIG. 11 contains graphs showing measurement results of dimension of the lower layer resist, facet size and etch rate, respectively, in examples.

Experiments 17, 8 and 18 (FIG. 11)

Results obtained by etching the lower layer resist film employing a gaseous mixture of $O_2$ gas and Ar gas at a chamber pressure of 10 mTorr and at a substrate temperature of −10 degree C. (Experiment 17), 20 degree C. (Experiment 8) and 60 degree C. (Experiment 18) are shown in graphs of FIG. 11.

Results show that lower substrate temperature could provide a reduced bottom dimension without reducing etch rate and without increasing facet size. In particular, the substrate temperature of −10 degree C. provided better result. The reason for obtaining better result is considered that amount of reaction products re-adhered on the side surface of the lower layer resist film is increased. As described above, it is confirmed that the substrate temperature is influential for providing a controlled dimension. In addition, a similar experiment conducted at a substrate temperature of −20 degree C. indicated that substrate temperature of −20 degree C. provided a reduced bottom dimension without reducing etch rate and without increasing facet size.

On the contrary, a similar experiment conducted at a substrate temperature of 30 degree C. indicated that substrate temperature of 30 degree C. provided an increased facet size and an increased bottom dimension. In addition, a substrate temperature of −30 degree C. caused problems in the manufacturing process. As described above, it was confirmed that preferable substrate temperature range was from −20 degree C. to 20 degree C. both inclusive.

A multiple-layered resist film was etched by a method same as employed in second embodiment (FIGS. 2A to 2C). Here, configuration of a multiple-layered resist film and etching condition were as follows.

<Condition for Etching Multiple-layered Resist Film>

[Multiple-layered Resist Film]
  lower layer resist film: formed to a thickness of 180 nm (by employing a resist solution "B200" (commercially available from JSR Co., Ltd., Tokyo Japan));
  silicon-containing intermediate layer: formed to a thickness of 50 nm (by employing a resist solution "SHB-A629" (commercially available from Shin-Etsu Chemical Co., Ltd., Tokyo Japan));
  upper layer resist film: formed to a thickness of 120 nm (by employing a resist solution "EP-038" (commercially available from Tokyo Ohka Kogyo Co., Ltd., Tokyo Japan));

[Exposure Condition for Upper Layer Resist Film]
  electron projection lithography (EPL): a pattern having line width of 50 nm/space of 50 nm is formed;

[Condition for Dry Etch for Lower Layer Resist Film]
  etcher: dual-wavelength RIE apparatus;
  Similar etching conditions such as type of etching gas, pressure, etching gas flow rate, temperature of semiconductor substrate or the like and similar evaluating conditions were employed as employed in Experiments 1 to 18.

Results show that similar tendencies as observed in Experiments 1 to 18 were confirmed. In addition, exposure apparatus is an apparatus that can utilize i-ray, KrF, ArF, ArF immersion, extreme ultraviolet (EUV) or the like.

It is apparent that the present invention is not limited to the above embodiment, and is modified and changed without departing from the scope and spirit of the invention.

What is claimed is:

1. A method of patterning a multiple-layered resist film, comprising:
  forming a lower layer resist film on a semiconductor substrate;
  forming a silicon-containing upper layer resist film on said lower layer resist film;
  patterning said silicon-containing upper layer resist film; and
  performing a Reactive Ion Etching (RIE) process for removing said lower layer resist film through a mask of said patterned silicon-containing upper layer resist film employing an etching gas containing oxygen gas and argon gas at pressure within a range of from 0.075 mTorr to 50 mTorr both inclusive, and flowing the oxygen gas at between about 100 and 200 sccm,
  wherein, in said performing said RIE process, due to a sputtering of said silicon-containing upper layer resist film during said RIE process, silicon-containing deposits are adhered onto a side surface of an opening formed by etching said lower layer resist film employing said silicon-containing upper layer resist film as a mask.

2. The method of patterning a multiple-layered resist film according to claim 1, wherein said silicon-containing deposits are produced by sputtering said silicon-containing upper layer resist film with argon atoms.

* * * * *